(12) United States Patent
Menkhoff

(10) Patent No.: US 7,881,405 B2
(45) Date of Patent: Feb. 1, 2011

(54) COMBINED MIXER AND POLYPHASE DECIMATOR

(75) Inventor: Andreas Menkhoff, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 797 days.

(21) Appl. No.: 11/689,839

(22) Filed: Mar. 22, 2007

(65) Prior Publication Data

US 2008/0232511 A1   Sep. 25, 2008

(51) Int. Cl.
*H03K 9/00* (2006.01)
(52) U.S. Cl. .................. 375/316; 375/235; 375/261; 375/340; 375/349; 375/350; 329/304; 329/306; 329/345; 329/346
(58) Field of Classification Search .................. 375/316, 375/322
See application file for complete search history.

(56) References Cited

U.S. PATENT DOCUMENTS 5,841,811 A * 11/1998 Song ........................ 375/235
6,049,573 A * 4/2000 Song ........................ 375/316

2003/0156669 A1   8/2003   Mammes et al.
2004/0057534 A1   3/2004   Masenten
2004/0121738 A1   6/2004   Ide
2006/0058001 A1   3/2006   Minnis et al.
2006/0067438 A1   3/2006   Menkhoff et al.
2006/0116091 A1   6/2006   Hammes et al.

* cited by examiner

*Primary Examiner*—David C Payne
*Assistant Examiner*—Leon Flores
(74) *Attorney, Agent, or Firm*—Schwegman Lundberg & Woessner, P.A.

(57) ABSTRACT

Some embodiments discussed relate to an apparatus and method for processing signals, comprising receiving an input signal and forming a stream of digital samples of the input signal by sampling at a sampling frequency and mixing the stream of digital samples using a mixer sequence having a sine sequence and a cosine sequence based on the sampling frequency to generate an input sequence, each of the sine sequence and the cosine sequence including a plurality of components in an arrangement such that at least one of the components has a zero value and the remaining components has a non-zero value, and filtering the input sequence using a plurality of polyphase filter parts, each corresponding to the non-zero components of the sine sequence and the cosine sequence, and selectively combining the outputs of the polyphase filter parts to generate an in-phase sequence and a quadrature sequence.

23 Claims, 8 Drawing Sheets

COMBINED MIXER AND POLYPHASE DECIMATOR

TECHNICAL FIELD

Embodiments described herein relate generally to digital signal processing (DSP) in radio frequency (RF) receivers and more particularly to polyphase decomposition.

BACKGROUND

Receivers employing DSP perform mixing and filtering in the digital domain. The cost of implementing a particular receiver using DSP components increases with the amount of processing required to perform the desired functions. The processing load of a particular DSP system depends on the functions implemented and on the complexity of the implementation of these functions.

In a receiver employing DSP, a received band-limited analog signal is sampled to produce a digital signal that is processed using DSP circuits. The received band limited analog-signal is sampled at a rate of two or more times higher than the bandwidth of the signal. The sampled signal is translated to a lower center frequency in the DSP circuits to allow further processing to be performed at a lower sampling rate. Decimation is a technique used to reduce the sampling rate of incoming signal to a receiver. Reduction in the cost of processing digital signals in various implementations of digital signal processing systems is desired.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
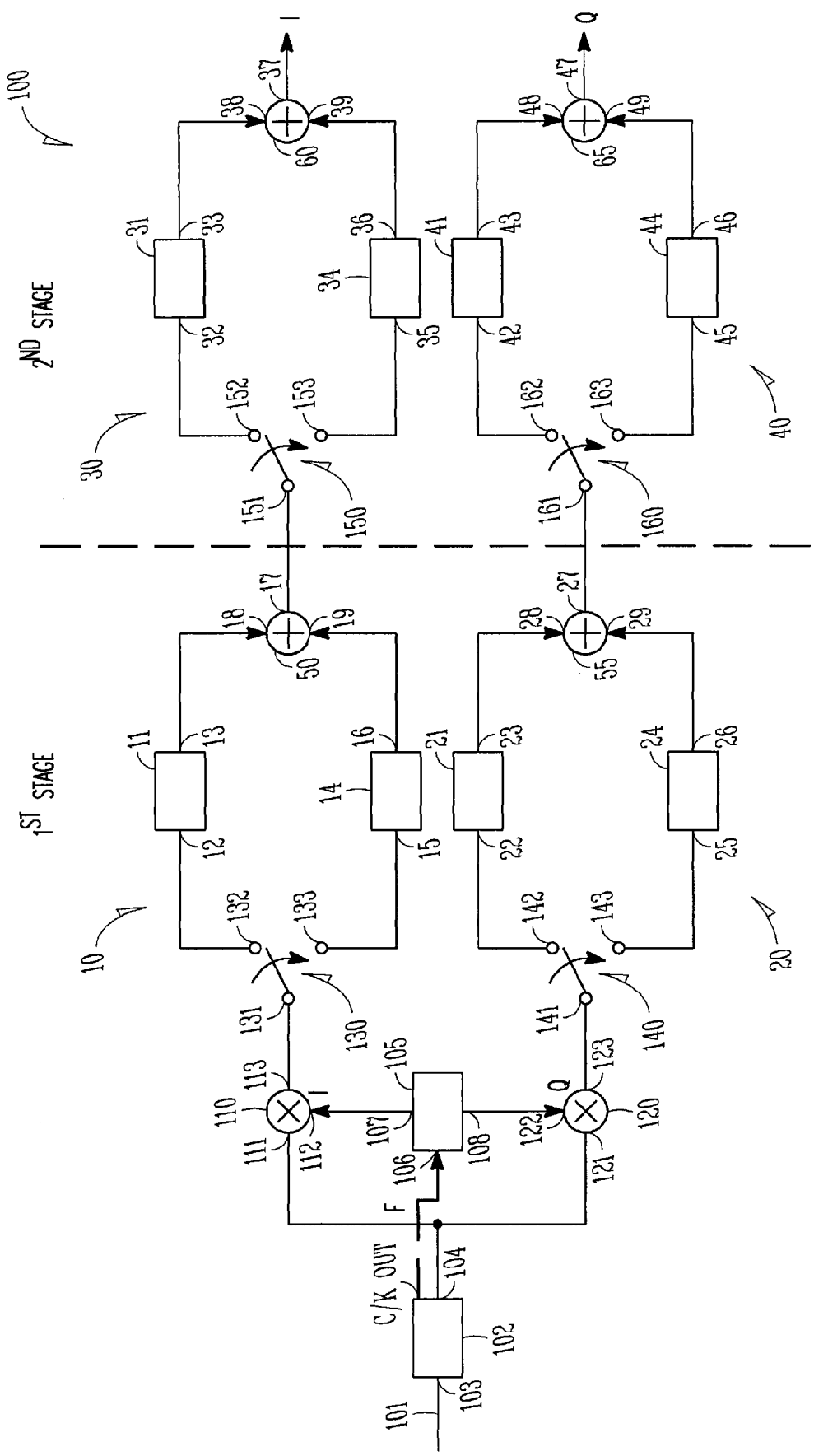
FIG. 1 illustrates schematic view of a receiver system implemented using mixers and sequential decimation filters.

Generally, in a digital receiver system, various digital processing blocks perform high-speed digitization, down-conversion, filtering, decimation, and demodulation. FIG. 1 illustrates a schematic view of a system 100 used in a low-IF receiver that performs high-speed digitization, filtering and decimation. System 100 includes an analog to digital converter (ADC) 102, mixers 110 and 120, digital local oscillator 105, commutators 130, 140, 150, 160, a first stage of filters 10, 20 and a second stage of filters 30, 40. First stage filter 10 includes polyphase filter parts 11, 14 and adder 50. First stage filter 20 includes polyphase filter parts 21, 24 and adder 55. Second stage filter 30 includes polyphase filter parts 31, 34 and adder 60. Second stage filter 40 includes polyphase filter parts 41, 44 and adder 65. ADC 102 includes an input 103 and an output 104. Mixer 110 includes inputs 111 and 112 and output 113. Mixer 120 includes inputs 121, 122 and output 123. Local oscillator 105 includes an input 106 and outputs 107, 108. Commutators 130 and 140 includes inputs 131 and 141 respectively and output contacts 132, 133 and 142, 143 respectively. Polyphase filter parts 11, 14, 21 and 24 include inputs 12, 15, 22 and 25 respectively and outputs 13, 16, 23 and 26 respectively. Adders 17, 27 includes inputs 18, 19 and 28, 29 respectively and outputs 50, 55 respectively. Commutators 150 and 160 includes inputs 151 and 161 respectively and output contacts 152, 153 and 162, 163 respectively. Polyphase filter parts 31, 34, 41 and 44 include inputs 32, 35, 42 and 45 respectively and outputs 33, 36, 43 and 46 respectively. Adders 37, 47 includes inputs 38, 39 and 48, 49 respectively and outputs 60 and 65 respectively.

According to FIG. 1, starting from left to right, input 103 of ADC 102 receives a real signal carried by communication link 101. Output 104 of ADC 102 is coupled to inputs 111 and 121 of mixers 110 and 120 respectively. Inputs 112, 122 of mixers 110, 120 are coupled to outputs 107, 108 of local oscillator 105, respectively. In the top portion of system 100, output 113 of mixer 110 is coupled to input 131 of commutator 130. Commutator 130 is configured to perform as a switch and switches alternately the connectivity between input 131 and output nodes 132 and 133. In the bottom portion of system 100, output 123 of mixer 120 is coupled to input 141 of commutator 140. Similar to commutator 130, commutator 140 is configured to perform as a switch and switches alternately the connectivity between input 141 and outputs 142 and 143.

Polyphase filter parts 11, 14 are coupled between commutator 130 and adder 50. Polyphase filter parts 21, 24 are coupled between commutator 140 and adder 55. Outputs 132 and 133 of commutator 130 are coupled to inputs 12 and 15 of polyphase filter parts 11 and 14, respectively. Outputs 142 and 143 of commutator 140 are coupled to inputs 22 and 25 of polyphase filter parts 21 and 24, respectively. Output 13 of low pass filter 11 is coupled to input 18 of adder 50. Output 16 of low pass filter 14 is coupled to input 19 of adder 50. Similarly, output 23 of polyphase filter part 21 is coupled to input 28 of adder 55 and output 26 of polyphase filter part 24 is coupled to input 29 of adder 55.

Output 17 of adder 50 is coupled to input 151 of commutator 150 and output 27 of adder 55 is coupled to input 161 of commutator 160. Second stage polyphase filter parts 31, 32 are coupled in parallel between commutator 150 and adder 60. Second stage polyphase filter parts 41, 44 are coupled in parallel between commutator 160 and adder 65. Outputs 152 and 153 of commutator 150 are coupled to inputs 32 and 35 of polyphase filter parts 31 and 34, respectively. Outputs 162 and 163 of commutator 160 are coupled to inputs 42 and 45 of polyphase filter parts 41 and 44, respectively. Output 33 of polyphase filter part 31 is coupled to input 38 of adder 60.

Output 36 of polyphase filter part 34 is coupled to input 39 of adder 60. Similarly, output 43 of polyphase filter part 41 is coupled to input 48 of adder 65 and output 46 of polyphase filter part 44 is coupled to input 49 of adder 65.

In operation, ADC 102 converts an analog input signal into a digital signal by sampling at a particular rate and providing the samples to mixers 110 and 120. In some embodiments, an anti-aliasing filter (not shown) is provided before ADC 102 to ensure that the bandwidth of the analog input signal to be sampled is limited to a desired frequency range and also to limit the additive noise spectrum and other interferences that may corrupt the desired portion of the analog input signal. Mixers 110 and 120 provide frequency conversion or translation and act as frequency multipliers. Each of mixers 110 and 120 have two inputs 111, 112 and 121, 122 and a single output 113, 123 respectively. The first inputs 111, 121 receives digital samples from ADC 102. The second input 112, 122 receives respectively a digital in-phase (I) and quadrature (Q) component of a local oscillator signal generated at digital local oscillator 105.

Digital in-phase (I) and quadrature (Q) components generated at outputs 107 and 108 arrive at mixers 110 and 120 respectively at the same sampling rate used in ADC 102. Digital local oscillator 105 is essentially a direct digital frequency synthesizer delivering sampled sine and cosine waveforms at a programmable frequency. Digital local oscillator 105 is driven by the sampling clock used at ADC 102. In addition, digital local oscillator 105 uses a phase accumulator and digital sine lookup table to generate complex output samples.

Output of mixers 110 and 120 includes signals having both a sum product and difference product of the frequencies. In some embodiments, only the portion having the difference product of the frequencies is retained while other mixer byproducts are removed. At mixers 110 and 120, the digitized RF input is multiplied with the sine and cosine signals received from digital local oscillator 105, a single-sideband frequency translation of the input signal is performed. This allows to translate the complex signal down to DC or 0 Hz, and makes it ideally suited for filtering that is performed in the following step.

Output signals of mixers 110 and 120 are provided to commutators 130 and 140 respectively, following which the digital signal is provided to a system of filters that are arranged in multiple stages. These filters arranged in multiple stages allow for decimation of the digital signal. Decimation allows for the reduction in the number of digital samples of discrete-time signals. In some embodiments, decimation is performed in two stages. In some embodiments, the sampling rate is reduced by a factor of two in a first stage of decimation performed by first stage N-band filters 10, 20. The sampling rate is further reduced by a factor of two in a following second stage of decimation performed by second stage N-band filters 30, 40. The overall sampling rate is reduced by a combined factor of four after the input signal has passed through the two stages of decimation performed using the filters shown in FIG. 1. In some embodiments, the filters used in the two stages are complex Finite Impulse Response (FIR) low pass digital filters or recursive Infinite Impulse Response (IIR) filters. In addition, the desired bandwidth of the received signal may be selected by programming the FIR filter coefficients.

Output digital signal from commutator 130 is distributed between a top leg and a bottom leg of a first stage N-band filter 10. First stage N-band filter 10 has N=2 and includes polyphase filter part 11 in the top leg and polyphase filter part 14 in the bottom leg. The output signals of polyphase filter parts 11 and 14 are provided to adder 50. Output 17 of adder 50 is provided to commutator 150.

Output digital signal from commutator 140 is distributed between a top leg and a bottom leg of a first stage N-band filter 20. First stage N-band filter 20 has N=2 and includes polyphase filter part 21 in the top leg and polyphase filter part 24 in the bottom leg. The output signals of polyphase filter part 21 and 24 are provided to adder 55. Output 27 of adder 55 is provided to commutator 160.

Output digital signal from commutator 150 is distributed between a top leg and a bottom leg of a second stage N-band filter 30. Second stage N-band filter 30 has N=2 and includes polyphase filter part 31 in the top leg and polyphase filter part 34 in the bottom leg. The output signals of low pass filters 31 and 34 are provided to adder 60. Output 37 of adder 60 provides the I-channel signal.

Output digital signal from commutator 160 is distributed between a top leg and a bottom leg of a set of second stage N-band filter 40. Second stage N-band filter 40 has N=2 and includes polyphase filter part 41 in the top leg and polyphase filter part 44 in the bottom leg. The output signals of low pass filters 41 and 44 are provided to adder 65. Output 47 of adder 65 provides the Q-channel signal which along with the I-channel signal from adder 60 undergoes further processing to retrieve the input signal.

Figure 2:
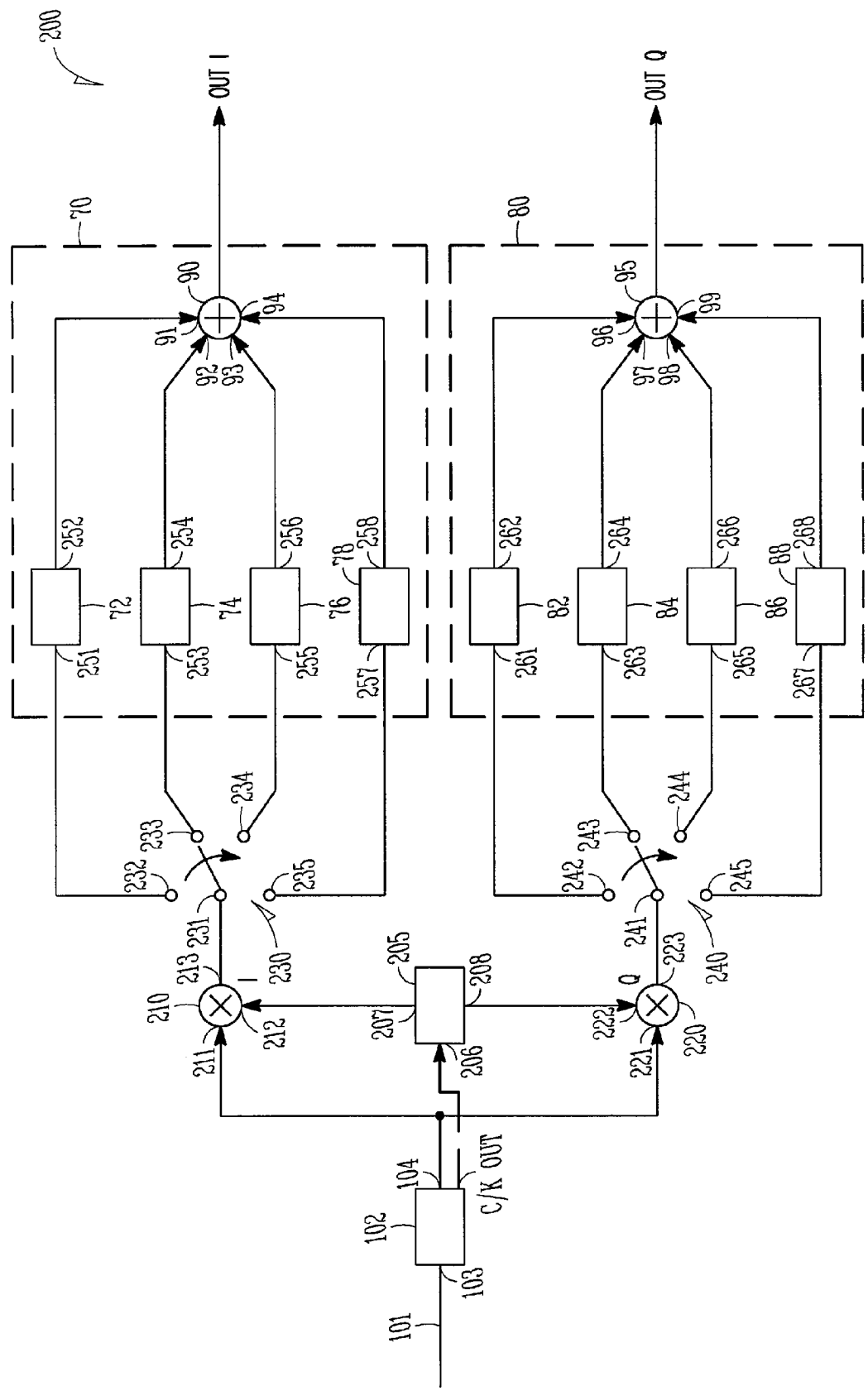
FIG. 2 illustrates a schematic view of a system implemented to perform the polyphase decimation function shown in FIG. 1, according to some embodiments of the invention.

FIG. 2 illustrates a schematic view of a system 200 implemented to perform the mixing and decimation function shown in FIG. 1. In some embodiments, system 200 includes an analog to digital converter (ADC) 102, mixers 210 and 220, a digital local oscillator 205, commutators 230 and 240, filters 70, 80. Filter 70 includes a set of I-channel polyphase filter parts 72, 74, 76, 78 and adder 90. Filter 80 includes a set of Q-channel polyphase filter parts 82, 84, 86, 88 and adder 95.

According to FIG. 2, starting from left to right, input 103 of ADC 102 receives a real signal carried by communication link 101. ADC 102 is coupled to mixer 210 and 220. Mixers 210 and 220 are coupled to a local oscillator 205. In the top portion of system 200, mixer 210 is coupled to commutator 230 which in turn is coupled to a set of polyphase filter parts 72, 74, 76, 78. Polyphase filter parts 72, 74, 76 and 78 are coupled in parallel between commutator 230 and adder 90. In the bottom portion of system 200, mixer 220 is coupled to commutator 240 which in turn is coupled to a set of polyphase filter parts 82, 84, 86, 88. Polyphase filter parts 82, 84, 86 and 88 are coupled in parallel between commutator 240 and adder 95.

With reference to FIG. 2, ADC 102 converts an analog input signal received using communication link 101 into a digital signal by sampling at a particular rate and providing the samples to mixers 204 and 206. In some embodiments, an anti-aliasing filter (not shown) is provided before ADC 102 to ensure that the bandwidth of the input analog signal to be sampled is limited to a desired frequency range and also to limit the additive noise spectrum and other interferences that may corrupt the desired portion of the input signal. Mixers 210 and 220 provide frequency conversion or translation and act as frequency multipliers. Each of mixers 210 and 220 have two inputs 211, 212 and 221, 222 respectively and a single output 213, 223 respectively. The first input 221 includes the digital samples received from ADC 102. These digital samples are received at each of mixers 210 and 220. The second input 212, 222 includes a digital in-phase (I) and quadrature (Q) component of a local oscillator signal generated at digital local oscillator 205 and provided to mixers 210 and 220 respectively. Digital in-phase (I) and quadrature (Q) components arrive at mixers 210 and 220 respectively at the sampling rate used in ADC 102. Digital local oscillator 205 is essentially a direct digital frequency synthesizer delivering sampled sine and cosine waveforms at a programmable frequency. Digital local oscillator 205 is driven by the sampling clock used at ADC 102. In addition, digital local oscillator 205 uses a phase accumulator and digital sine lookup table to generate complex output samples.

In some embodiments, the sampled sine and cosine waveforms (sequences) generated at digital local oscillator 205 are chosen to have alternating zeros. For example, one sequence for cosine waveform could take values $\{1, 0, -1, 0\}$ and for the sine waveform the values could take $\{0, 1, 0, -1\}$. In alternate embodiments, other sequences having an different sequences of zeros may be chosen for the sine sequence and the cosine sequence.

Output of mixers 210 and 220 include signals having both a sum product and difference product of the frequencies and are provided to inputs 231 and 241 of commutators 230 and 240, respectively. In some embodiments, only the portion having the difference product of the frequencies is retained while other mixer byproducts are removed. At mixers 210 and 220, the digitized RF input is multiplied with the sine and cosine signals received from digital local oscillator 205, a single-sideband frequency translation of the input signal is performed. This allows to translate the complex signal down to DC or 0 Hz, and makes it ideally suited for filtering that is performed in the following step. Commutators 230 and 240 provides the received signals at inputs 231 and 241 to outputs 232, 233, 234, 235 and 242, 243, 244, 245, respectively.

Figure 3:
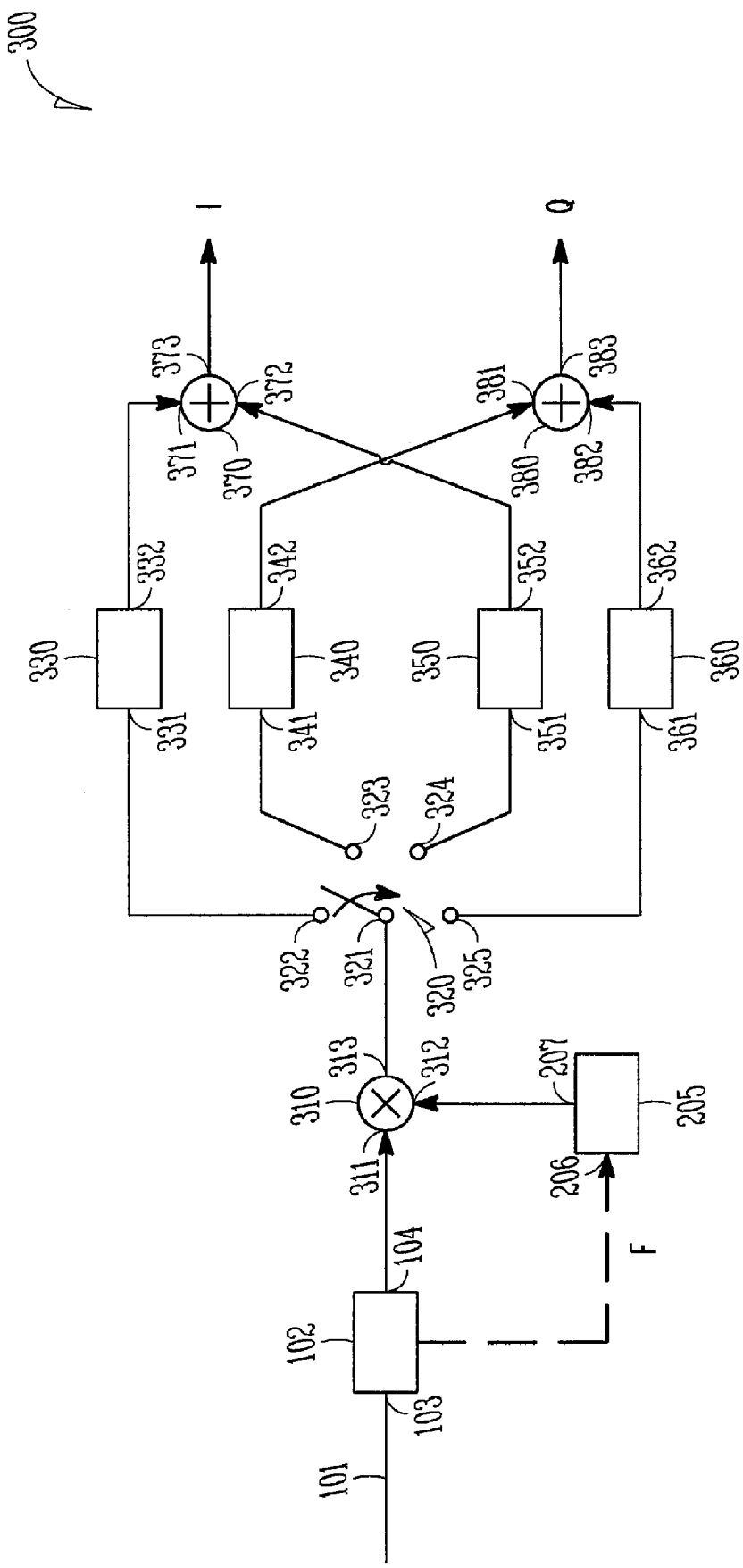
FIG. 3 illustrates a schematic view of a system implemented to perform the polyphase decimation function shown in FIG. 2, according to some embodiments of the invention.

Output signals of mixers 210 and 220 are provided to commutators 230 and 240 respectively, following which the digital signal is provided to two sets of N-band filters 70, 80 to allow for decimation of the digital signal. In FIG. 3, N=4 for the two sets of N-band filters. Decimation allows for the reduction in the number of digital samples of discrete-time signals. Decimation is performed in a single stage. The sampling rate is reduced by a factor of four in a single stage of decimation performed using a top set of N-band filters 70 and a bottom set of N-band filters 80. Top set of N-band filters includes polyphase filter parts 72, 74, 76, 78 and the bottom set of N-band filters includes polyphase filter parts 82, 84, 86, 88. The overall sampling rate is reduced by a factor of four after the input signal has passed through the decimation stage performed using the filters shown in FIG. 2. In some embodiments, the filters used in FIG. 2 are complex Finite Impulse Response (FIR) low pass digital filters. In addition, the desired bandwidth of the received signal may be selected by programming the FIR filter coefficients.

In FIG. 2, N=4 for the N-band filter. Output signal of commutator 230 are distributed between the various legs of polyphase filter parts 72, 74, 76 and 78. Output signals of polyphase filter parts 72, 74, 76, 78 are provided to adder 90 and combined to generate the I-channel signal ready for further processing. Similarly, the output signal of commutator 240 is distributed between the various legs of polyphase filter parts 82, 84, 86 and 88. Output signals of polyphase filter parts 82, 84, 86, 88 are provided to adder 95 and combined to generate the Q-channel signal ready for further processing. In some embodiments, decimation filters mentioned above may include low pass filters. In some embodiments, decimation filters may include bridge-wave digital filters with N parallel all-pass filters. In preferred embodiments, the decimation filters mentioned above may include recursive IIR filters.

FIG. 3 illustrates a system 300 of FIG. 2, according to some embodiments of the invention. System 300 is a combined mixer and polyphase decimator system incorporating all the functionalities of system shown in FIG. 2. System 300 includes ADC 102, mixer 310, local oscillator 205, commutator 320, polyphase filter parts 330, 340, 350, 360, and adders 370 and 380. ADC 102 includes an input 103 and an output 104. Mixer 310 includes an inputs 311, 312 and an output 313. Local oscillator 205, includes an input 206 and an output 207. Commutator 320 includes an input 321 and output terminals 322, 323, 324 and 325. Polyphase filter parts 330, 340, 350 and 360 includes inputs 331, 341, 351 and 361 and outputs 332, 342, 352 and 362. Adders 370 and 380 include inputs 371, 372 and 381, 382 respectively and outputs 373 and 383 respectively.

As shown in FIG. 3, starting from left to right, output 104 of ADC 102 is coupled to input 311 of mixer 310. Also, input 312 of mixer 310 is coupled to output 207 of local oscillator 205. Output 313 of mixer is coupled to the input 321 of commutator 320. Commutator 320 couples to a set of polyphase filter parts 330, 340, 350 and 360 at connection terminals 322, 323, 324 and 325, respectively. Outputs 332 and 352 of polyphase filter parts 330 and 350, respectively are coupled to inputs 371 and 372 of adder 370. Similarly, output 342 and 362 of polyphase filter parts 340 and 360, respectively are coupled to inputs 381 and 382 of adder 380. Adder 370 generates the I-channel signal at output 373 and adder 380 generates the Q-channel signal at output 383. Both the I-channel signal and the Q-channel signal are made available for further processing in a circuit that includes digital to analog converter and a phase extractor.

In some embodiments, the even-numbered samples of the I-sequence and the odd-numbered samples of the Q-sequence are assigned by the mixer. As a result, the I-sequence and the Q-sequence are now offset in the group delay. The task of the sequential decimation filter is, in addition to limiting the frequency band, to compensate for the offset of the group delay.

In some embodiments, the mixer is adapted such that the sine and cosine sequences contains as many zeros as possible. Especially advantageous is a mixer frequency of fs/4 with the cosine sequence being $\{1, 0, -1, 0\}$ and the sine sequence $\{0, 1, 0, -1\}$. In some embodiments in where the mixer frequency is fs/8 the cosine sequence would be $\{1, 0.707, 0, -0.707, -1, -0.707, 0, 0.707\}$ and sine sequence would be $\{0, -0.707, -1, -0.707, 0, 0.707, 1, 0.707\}$. In some embodiments, the number of polyphases are chosen such that length of the mixer sequence when divided by the number of polyphases results in a whole number. In some embodiments, the number of polyphases are chosen such that the number of polyphases when divided by the length of the mixer results in a whole number. Additionally, the scan rate is reduced using one step as opposed to multiple steps as described in FIG. 1 and FIG. 2.

Figure 4A:
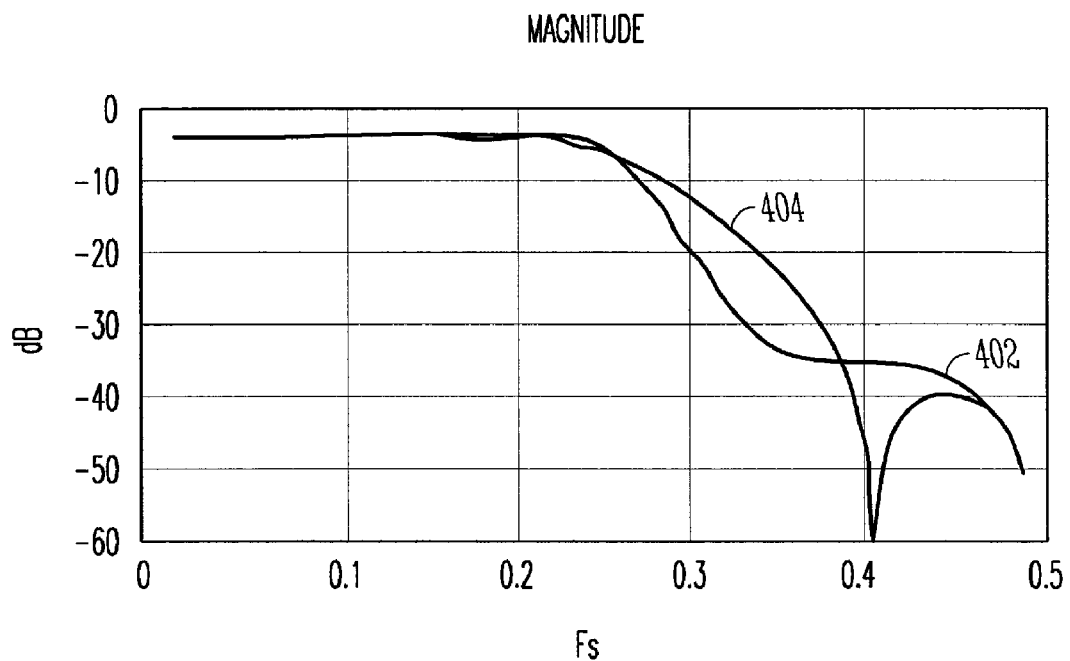
FIG. 4A and FIG. 4B illustrate the frequency response and group delay respectively of the polyphase decimation filters shown in FIG. 3, according to some embodiments of the invention.
Figure 4B:
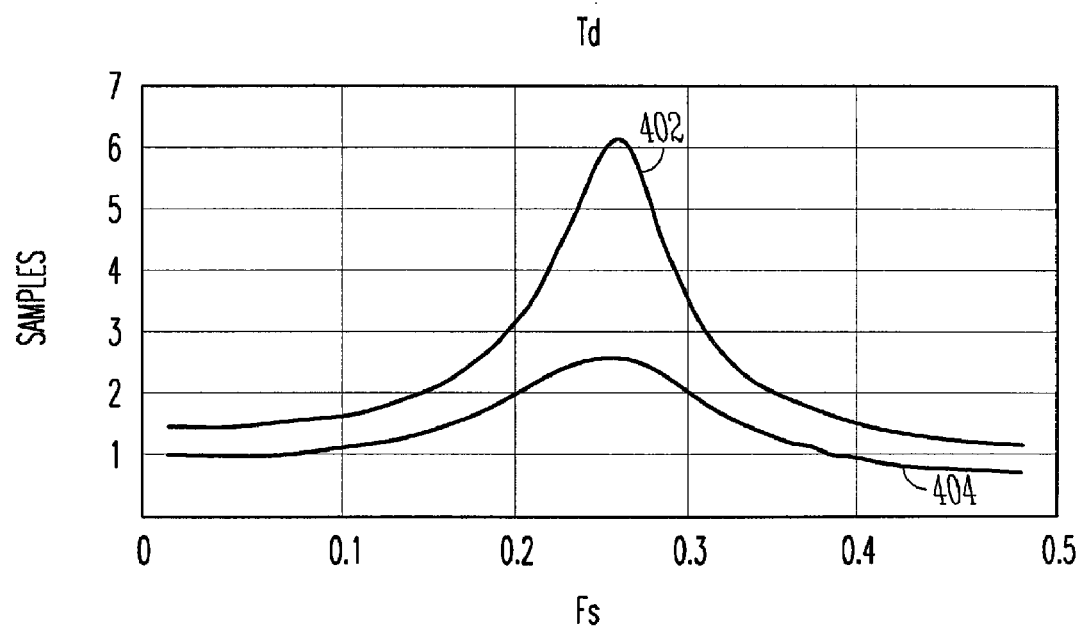

FIG. 4A and FIG. 4B illustrates the frequency response and group delay of the filters used on the samples of In-phase (I) and Quadrature (Q) sequences, according to some embodiments of the invention. In some embodiments, curve 402 represents the filter characteristics of the filters used for the I-channel shown in FIG. 3. In some embodiments, curve 404 represents the filter characteristics of the filters used in the Q-channel shown in FIG. 3.

Figure 5A:
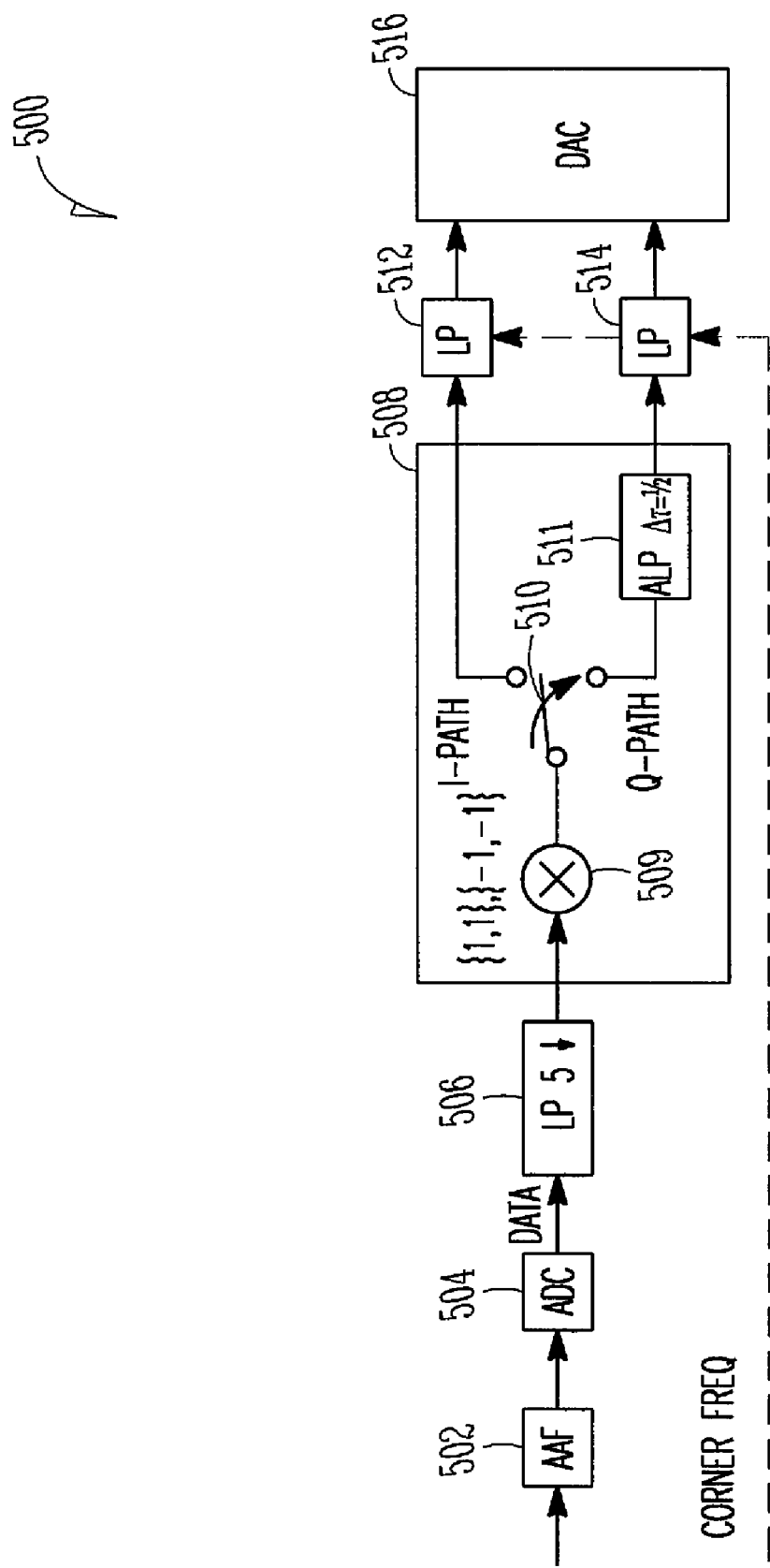
FIG. 5 illustrates a schematic view of a receiver system, according to some embodiments of the invention.

FIG. 5A illustrates a schematic view of a receiver system 500, according to some embodiments of the invention. Receiver system 500 includes an anti-aliasing filter 502, an analog-to-digital converter 504, a low pass filter 506, a combined mixer and polyphase decimator system 508, low pass filters 512 and 514 and a digital-to-analog converter 516. The combined mixer and polyphase decimator system 508 includes a mixer 509, a commutator 510, an I-path and a Q-path. In some embodiments, the I-path is a straight path without any decimation filters and the Q-path includes a delay element 511. Commutator 510 switches the output digital stream generated at mixer 509 between the I-path and the Q-path.

Figure 5B:
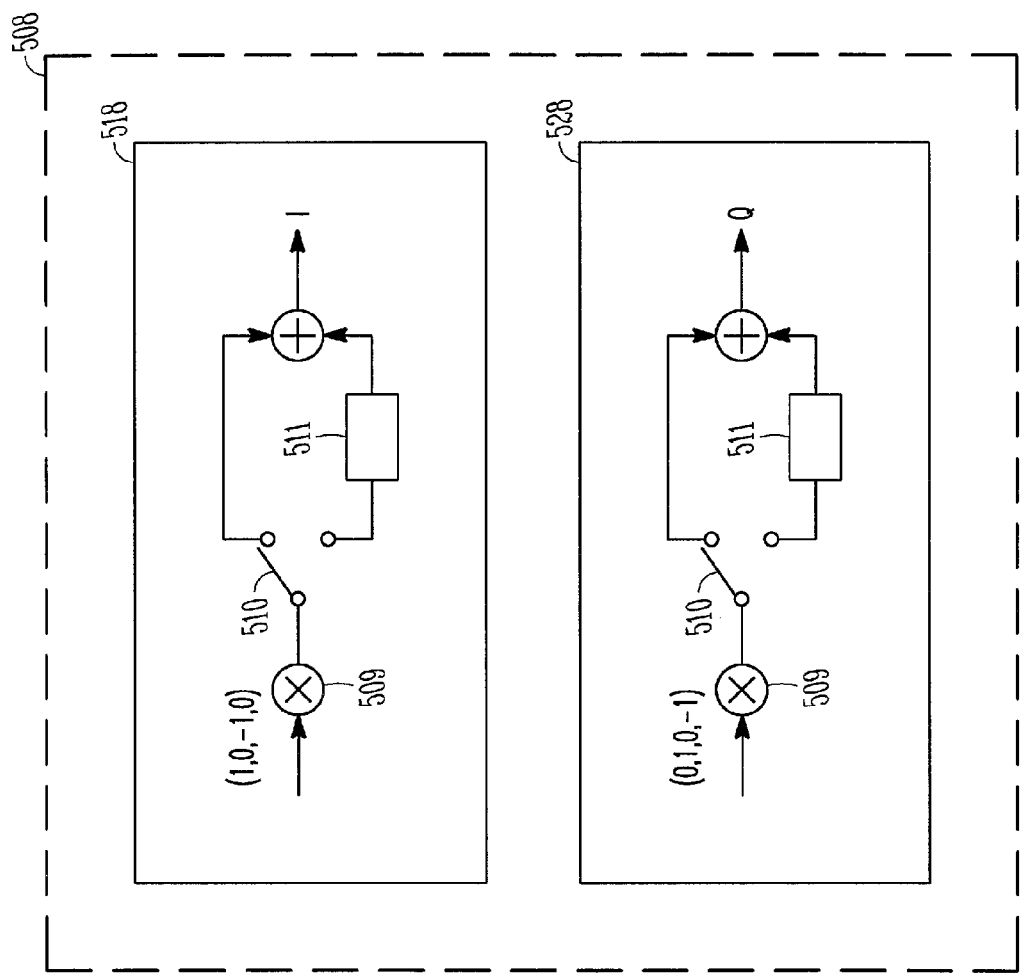

FIG. 5B illustrates a schematic view of the combined mixer and polyphase decimator system 508 shown in FIG. 5A. Combined mixer and polyphase decimator system 508 includes a cosine-mixer block 518 and a sine-mixer block 528. In some embodiments, combined mixer and polyphase decimator system 508 has mixer coefficients {1, 1, −1, −1}. In some embodiments, mixer coefficients {1, 1, −1, −1} are derived by combining a cosine-mixer block 518 for the I-path having mixer coefficients {1, 0, −1, 0} and a sine-mixer block 528 for the Q-path having mixer coefficients {0, 1, 0, −1}. Consequently, a decimation by a factor of two is achieved because the samples that are multiplied by zero are removed. This allows the samples of the I-path and the samples of the Q-path that were pushed to the high rate by one cycle to be considered as a joint (I, Q) pair. The Q-path is thus incorrectly pushed to the low rate by one half-cycle too soon. The all-pass filter with a half-cycle group delay restores the correct timing of the I and Q-paths.

In some embodiments, receiver system 500 is used in a remote keyless entry system. In some embodiments, receiver system 500 may be used in blue-tooth enabled digital communication devices.

Figure 6:
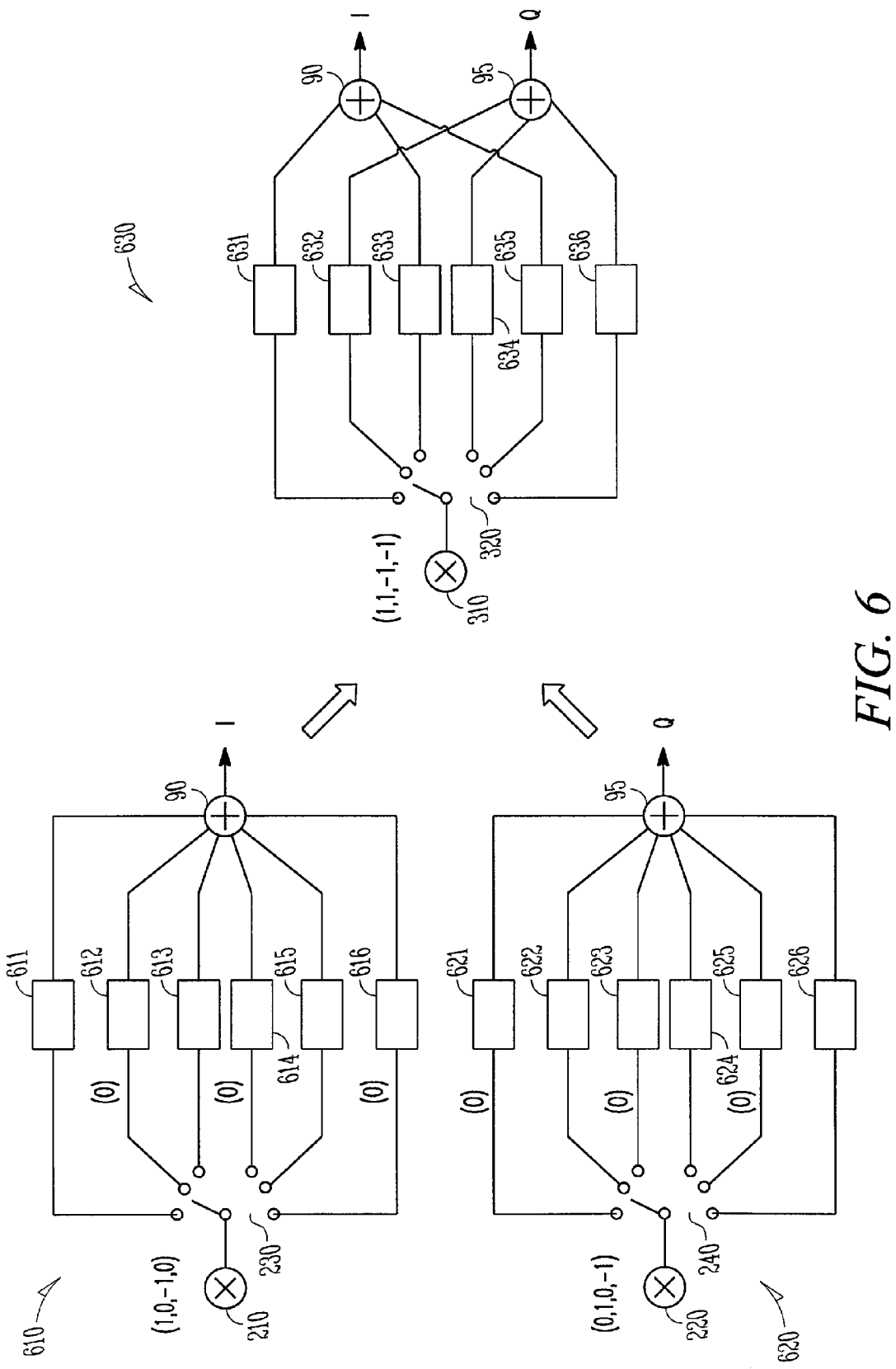
FIG. 6 shows a flow diagram illustrating a method of processing digital samples of an input signal, according to some embodiments of the invention.

FIG. 6 illustrates a schematic view of a system 630 showing a combined mixer and polyphase decimator, according to some embodiments of the invention. System 630 is formed by the combination of systems 610 and 620. In some embodiments, system 610 includes mixer 210 with cosine sequence (1, 0, −1, 0), commutator 230, polyphase filter parts 611, 612, 613, 614, 615, 616 and adder 90. In some embodiments, system 620 includes mixer 220 with sine sequence (0, 1, 0, −1), commutator 240, polyphase filter parts 621, 622, 623, 624, 625, 626 and adder 95. System 630 includes mixer 310 with sequence (1, 1, −1, −1) coupled to commutator 320. Commutator 320 is coupled to polyphase filter parts 631, 632, 633, 634, 635, 636. Output of polyphase filter parts 631, 633, and 635 are coupled to adder 90. Output of polyphase filter parts 632, 634, and 636 are coupled to adder 95. At the output of adder 90 the I-channel signal is generated and at the output of adder 95 the Q-channel signal is generated.

Figure 7:
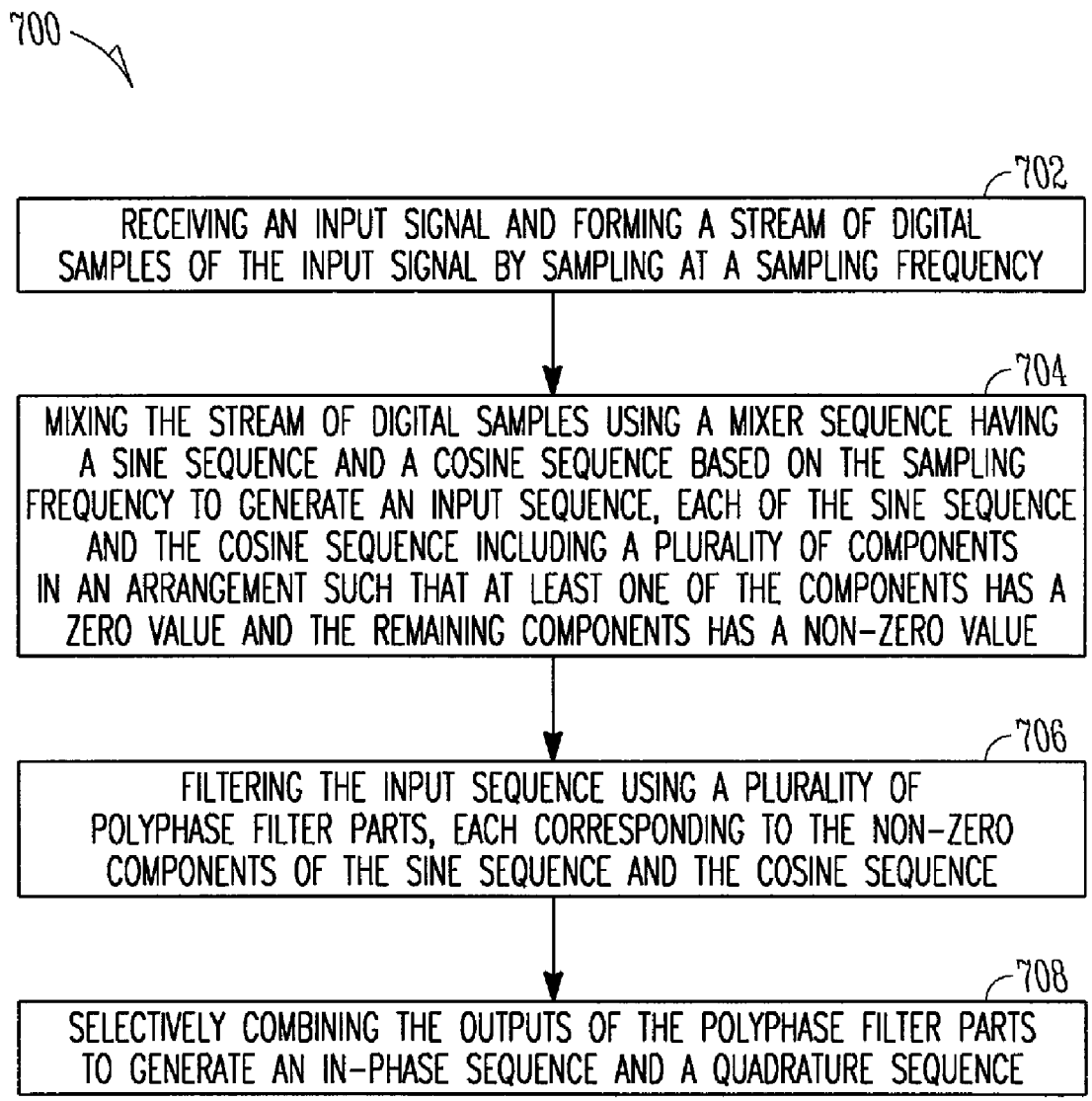
FIG. 7 shows a flow diagram illustrating a method of processing samples of an input signal according to some embodiments of the invention.

FIG. 7 shows a flow diagram 700 illustrating a method of processing digital samples of an input signal, according to one embodiment of the invention.

At 702, the method includes receiving an input signal and forming a stream of digital samples of the input signal by sampling at a sampling frequency.

At 704, the method includes mixing the stream of digital samples using a mixer sequence having a sine sequence and a cosine sequence based on the sampling frequency to generate an input sequence, each of the sine sequence and the cosine sequence including a plurality of components in an arrangement such that at least one of the components has a zero value and the remaining components has a non-zero value.

At 706, the method includes filtering the input sequence using a plurality of polyphase filter parts, each corresponding to the non-zero components of the sine sequence and the cosine sequence.

At 708, the method includes selectively combining the outputs of the polyphase filter parts to generate an in-phase sequence and a quadrature sequence.

In some embodiments, selecting the sine sequence includes having even-numbered components being zero and selecting the cosine sequence includes having odd-numbered components being zero.

In some embodiments, the sine sequence and the cosine sequence is selected such that the sine sequence includes a sequence given by (0, 1, 0, −1) and the cosine sequence includes a sequence given by (1, 0, −1, 0).

In some embodiments, the sine sequence and the cosine sequence is selected in such a manner that the sine sequence includes a sequence given by (0, −0.707, −1, −0.707, 0, 0.707, 1, 0.707) and the cosine sequence includes a sequence given by (1, 0.707, 0, −0.707, −1, −0.707, 0, 0.707).

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A system implemented method, comprising:
   receiving an input signal and forming a stream of digital samples of the input signal by sampling at a sampling frequency;
   mixing, using a single mixer, the stream of digital samples using a mixer sequence having a sine sequence and a cosine sequence based on the sampling frequency to generate an input sequence, the mixing including receiving the sine sequence and the cosine sequence at the single mixer, each of the sine sequence and the cosine sequence including a plurality of components in an arrangement such that at least one of the components has a zero value and the remaining components has a non-zero value, and the mixing including combining the sine sequence and the cosine sequence such that the mixer sequence comprises (1, 1) or (−1, −1); and filtering the input sequence using a plurality of polyphase filter parts, each corresponding to the non-zero components of the sine sequence and the cosine sequence, and selectively combining the outputs of the polyphase filter parts to generate an in-phase sequence and a quadrature sequence.

2. The method of claim 1, wherein the number of plurality of polyphase filter parts divided by the length of the mixer sequence is a whole number.

3. The method of claim 1, wherein the length of the mixer sequence divided by the number of the plurality of polyphase filter parts is a whole number.

4. The method of claim 1, wherein the sine sequence includes odd-numbered components being zero and the cosine sequence includes even-numbered components being zero.

5. The method of claim 1, wherein the sine sequence includes even-numbered components being zero and the cosine sequence includes odd-numbered components being zero.

6. The method of claim 1, wherein the sine sequence and the cosine sequence is selected such that the sine sequence includes (0, 1, 0, −1) and the cosine sequence includes (1, 0, −1, 0).

7. The method of claim 1, wherein the sine sequence and the cosine sequence is selected such that the sine sequence includes (0, −0.707, −1, −0.707, 0, 0.707, 1, 0.707) and the cosine sequence includes (1, 0.707, 0, −0.707, −1, −0.707, 0, 0.707).

8. The method of claim 1, wherein filtering the input sequence using a plurality of polyphase filter parts includes filtering the input sequence using a plurality of all-pass filters.

9. The method of claim 1, wherein filtering the input sequence using a plurality of polyphase filter parts includes filtering the input sequence using a plurality of low-pass filters.

10. The method of claim 1, wherein the filtering the input sequence using a plurality of polyphase filter parts includes receiving the input sequence from the single mixer.

11. An apparatus comprising:
a receiver to convert an input signal into a stream of digital samples of the input signal by sampling at a sampling frequency;
a single mixer coupled to the receiver, the single mixer adapted to receive a sine sequence and a cosine sequence and to mix the stream of digital samples using a mixer sequence having the sine sequence and the cosine sequence based on the sampling frequency to generate an input sequence, each of the sine sequence and the cosine sequence including a plurality of components in an arrangement such that at least one of the components has a zero value and the remaining components has a non-zero value, and the single mixer adapted to combine the sine sequence and the cosine sequence such that the mixer sequence comprises (1, 1) or (−1, −1); and
a filter coupled to the single mixer, wherein the filter is configured to filter the input sequence using a plurality of polyphase filter parts, each corresponding to the non-zero components of the sine sequence and the cosine sequence, and selectively combining the outputs of the polyphase filter parts to generate an in-phase sequence and a quadrature sequence.

12. The apparatus of claim 11, wherein the number of plurality of polyphase filter parts divided by the length of the mixer sequence is a whole number.

13. The apparatus of claim 11, wherein the length of the mixer sequence divided by the number of the plurality of polyphase filter parts is a whole number.

14. The apparatus of claim 11, wherein the sine sequence includes odd-numbered components being zero and the cosine sequence includes even-numbered components being zero.

15. The apparatus of claim 11, wherein the sine sequence includes even-numbered components being zero and the cosine sequence includes odd-numbered components being zero.

16. The apparatus of claim 11, further comprising a local oscillator configured to provide the sine sequence and the cosine sequence to the single mixer.

17. The apparatus of claim 11, wherein the plurality of polyphase filter parts comprises a plurality of all-pass filters.

18. The apparatus of claim 11, wherein the plurality of polyphase filter parts comprises a plurality of low-pass filters.

19. The apparatus of claim 11, wherein the plurality of polyphase filter parts are configured to receive the input sequence from the single mixer.

20. A system, comprising:
an anti aliasing filter;
an analog-to-digital converter coupled to the anti-aliasing filter and adapted to receive an input signal from the anti-aliasing filter and form a stream of digital samples of the input signal by sampling at a sampling frequency;
a single mixer coupled to the analog-to-digital converter, the single mixer adapted to receive a sine sequence and a cosine sequence and to mix the stream of digital samples using a mixer sequence having the sine sequence and the cosine sequence based on the sampling frequency to generate an input sequence, each of the sine sequence and the cosine sequence including a plurality of components in an arrangement such that at least one of the components has a zero value and the remaining components has a non-zero value, and the single mixer adapted to combine the sine sequence and the cosine sequence such that the mixer sequence comprises (1, 1) or (−1, −1); and
a means for filtering the input sequence using a plurality of polyphase filter parts, each corresponding to the non-zero components of the sine sequence and the cosine sequence; and
a combiner coupled to the means for filtering and configured to selectively combine the outputs of the polyphase filter parts to generate an in-phase sequence and a quadrature sequence.

21. The system of claim 20, wherein the means for filtering the input sequence further comprises a filter including a plurality of all-pass filters.

22. The system of claim 20, wherein the means for filtering the input sequence further comprises a filter including a plurality of low-pass filters.

23. The system of claim 20, wherein the plurality of polyphase filter parts are configured to receive the input sequence from the single mixer.

* * * * *